United States Patent
Gan et al.

(10) Patent No.: US 6,978,433 B1
(45) Date of Patent: Dec. 20, 2005

(54) METHOD AND APPARATUS FOR PLACEMENT OF VIAS

(75) Inventors: Andy H. Gan, San Jose, CA (US); Nigel G. Herron, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 614 days.

(21) Appl. No.: 10/245,162

(22) Filed: Sep. 16, 2002

(51) Int. Cl.$^7$ ............................................. G06F 17/50
(52) U.S. Cl. ..................... 716/12; 716/1; 716/8; 716/9; 716/14
(58) Field of Search .............................. 716/1, 8, 9, 12, 716/14

(56) References Cited

U.S. PATENT DOCUMENTS 5,847,968 A * 12/1998 Miura et al. ................... 716/8

* cited by examiner

*Primary Examiner*—Thuan Do
(74) *Attorney, Agent, or Firm*—W. Eric Webostad

(57) ABSTRACT

Method and apparatus for placement of vias is described. More particularly, source power and ground vias are placed in partial response to locations where conductive lines cross over a reserved region. The reserved region is reserved for an embedded device, and is reserved in a layout database of a host device.

21 Claims, 7 Drawing Sheets

METHOD AND APPARATUS FOR PLACEMENT OF VIAS

FIELD OF THE INVENTION

The present invention relates generally to placement of power and ground vias, and more particularly to routing power and ground vias to a core embedded in a programmable logic device.

BACKGROUND OF THE INVENTION

Programmable logic devices exist as a well-known type of integrated circuit that may be programmed by a user to perform specified logic functions. There are different types of programmable logic devices, such as programmable logic arrays (PLAs) and complex programmable logic devices CPLDs). One type of programmable logic devices, called a field programmable gate array (FPGA), is very popular because of a superior combination of capacity, flexibility and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

A recent development in FPGA technology involves providing FPGAs comprising a plurality of what are known as "standard cells." These "standard cells" are provided inside an FPGA as functional blocks and have a set height. Notably, the term "standard cell" is not to imply that any standard, de facto or otherwise, exists, as standard cell size may vary from company to company. So, for example, logic blocks, such as a flip-flop, a NAND gate, and an inverter, among other well-known logic circuits, each will lay out with a same height, but may have different lengths. This height is conventionally dependent on pitch of a company's integrated circuit process for one or more interconnect or metal layers. A standard cell may be made up of several logic blocks, each with a same height, but possibly with different lengths. Thus, each standard cell will have a same height but may have varying lengths. Standard cells may be assembled for providing interconnectivity logic or "glue logic." Thus, an FPGA may be connected to an embedded device to carry out complex tasks.

For an embedded core in an integrated circuit, such as an FPGA with an embedded microprocessor core, a portion of the integrated circuit is reserved for the embedded core and glue logic. This reserved area for an FPGA may mean removal of one or more CLBs and block memories, among other pre-designed circuit elements. In other words, as an FPGA is designed in a modular manner, some modules may be removed for insertion of a block, such as an embedded device (embedded core and glue logic). However, an existing FPGA layout having an area blocked out for an embedded device causes termination of some signals, namely, those signals having terminated conductive or "metal" lines previously extending into the reserved area. In contrast, other metal lines are not terminated, and thus extend over the reserved area. So lower metal layers may be affected and higher metal layers may not be affected by embedding of a core with respect to interconnectivity between the integrated circuit and the embedded device.

This duality of affected and unaffected metal layers is most noticeable in power and ground interconnectivity. In order to reduce effects of electro-migration, multiple paths are provided to power and ground. Prior to the present invention, these power and ground interconnects were done manually after embedded device and FPGA databases had been merged or integrated. Manually laying out connections by searching for available tracks was time consuming. This involved examining a complete placement of blocks with all routing to such blocks, and placement of a conductor between metal lines and dropping vias at junction points of immediately spaced-apart upper and lower metal lines. However, without such additional distribution of power and ground interconnectivity, current-resistance (IR) losses would be too great, and electro-migration effects could, in some instances, create gradual degradation of interconnects causing long term reliability issues. Not only was this interconnection process time consuming, it was an iterative process conventionally requiring multiple iterations of layout-versus-schematic (LVS) and design-rule-check (DRC) steps. Additionally, conventionally placement of "jumpers" was done near an input/output ring already congested with metal lines.

Accordingly, it would be desirable and useful to provide means for placement and routing of power and ground interconnects with less, if any, manual processing as compared with prior placement and routing of power and ground interconnects.

SUMMARY OF THE INVENTION

An aspect of the present invention is a process for forming vias between conductive lines at different layer levels. A host integrated circuit layout database is obtained. An embedded core region is defined within the host integrated circuit layout database. At least one of a source power line and a ground line extending over the embedded core region is determined from the host integrated circuit layout database for a layer level. Locations where the at least one of the source power line and the ground line overlap a perimeter of the embedded core region is determined. The at least one of the source power line and the ground line is planned for placement. Via placement is planned from the at least one of the source power line and the ground line in partial response to the locations determined.

An aspect of the present invention is a process for automating via placement and routing. A first layout database is obtained for a host integrated circuit device in a binary format. A reserved area is reserved in the first layout database for placement of a core integrated circuit device and interconnect logic at least in part for coupling the core integrated circuit device to the host integrated circuit device. The reserved area is limited in part to a first group of selected metal layers. From the first layout database layout names and coordinates are accessed for conductive lines extending over the reserved area and not part of the first group of selected metal layers, as the conductive lines are part of a second group of selected metal layers. Axis intersection coordinates are determined for the conductive lines for an x-axis and a y-axis corresponding to the reserved area. Overlaps are calculated for the conductive lines for the second group of selected metal layers, and vias are placed in response to the overlaps calculated.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
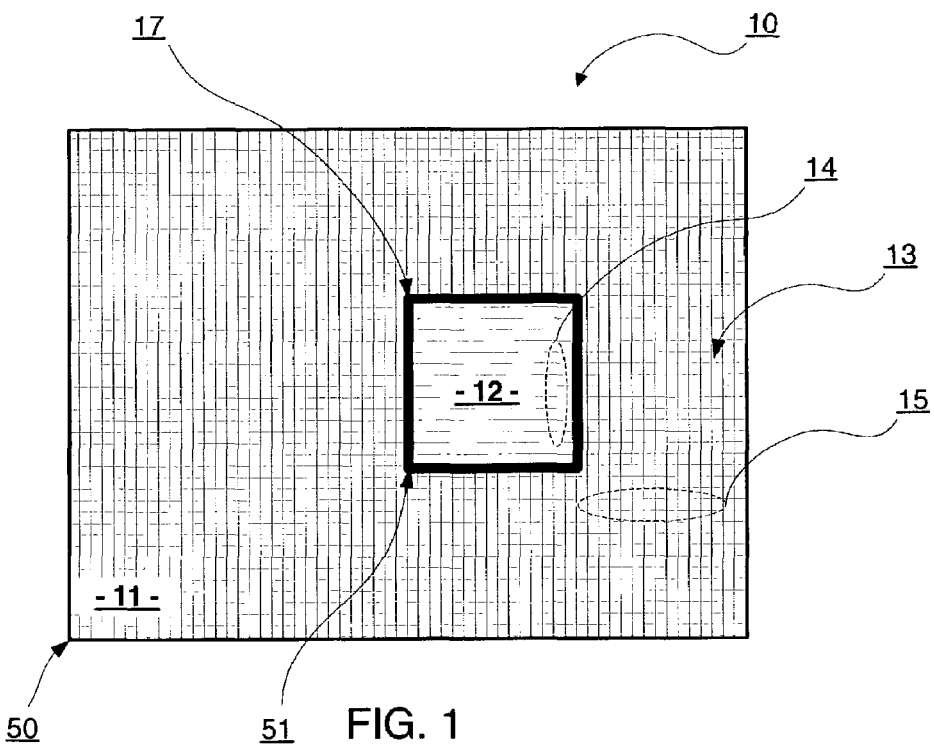
FIG. 1 is a block diagram of an exemplary embodiment of an integrated circuit in accordance with one or more aspects of the present invention.

Referring to FIG. 1, there is shown a block diagram of an exemplary embodiment of an integrated circuit 10 in accordance with one or more aspects of the present invention. Integrated circuit 10 comprises a host device 11 and an embedded device 12. Host device 11 comprises at least two metal layers forming a grid 13. Embedded device 12 is interconnected to host device 11 using at least in part grid 13 formed of vertical traces, stripes or tracks 15 and horizontal traces, stripes or tracks 14. However, while vertical traces 15 of one metal layer are terminated at a boundary 17 of a reserved area for embedded device 12, horizontal traces 14 extend over the reserved area for embedded device 12. Thus, for example, a metal layer at one elevation may have terminated lines into this reserved area, while another metal layer at another elevation may have lines that extend over this reserved area.

Figure 2:
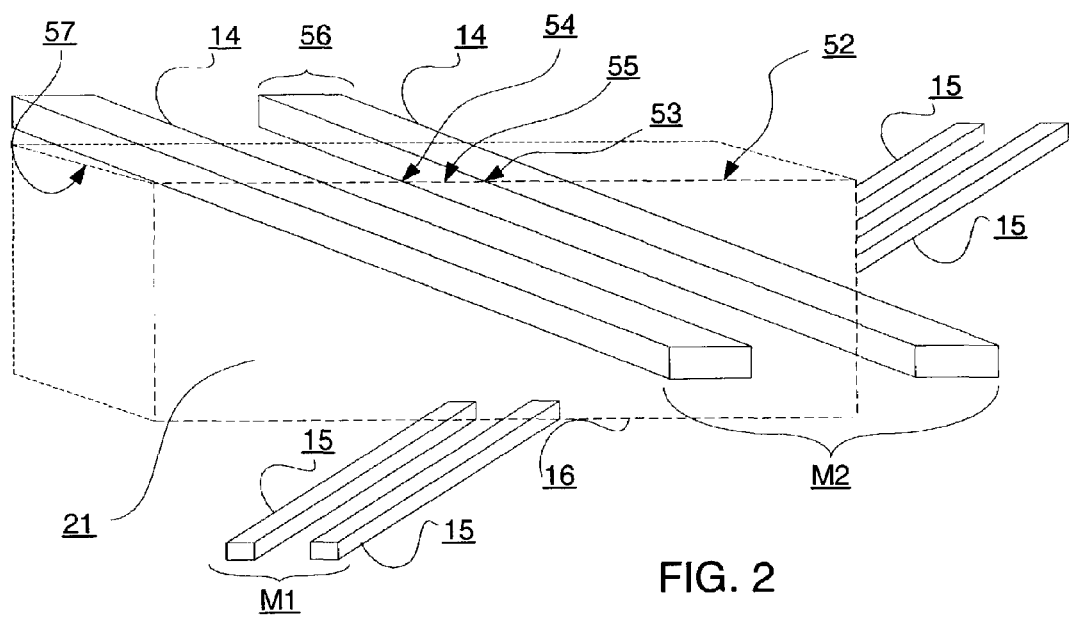
FIG. 2 is a perspective view of a portion of the integrated circuit of FIG. 1.

Referring to FIG. 2, there is shown a perspective view of a portion of integrated circuit 10 of FIG. 1. A portion of a reserved or embedded core region 16 for embedded device 12 has horizontal traces 14 extending over it and has vertical traces 15 terminating at it. Notably, metal layer one ("M1") is used to form vertical traces 15, and metal layer two ("M2") which extends above M1 is used to form horizontal traces 14. Accordingly, it should be appreciated that conventionally one or more lower metal layers have terminated lines to a reserved three-dimensional embedding region, while one or more higher metal layers are not terminated in response to such a reserved three-dimensional embedding region.

Figure 3:
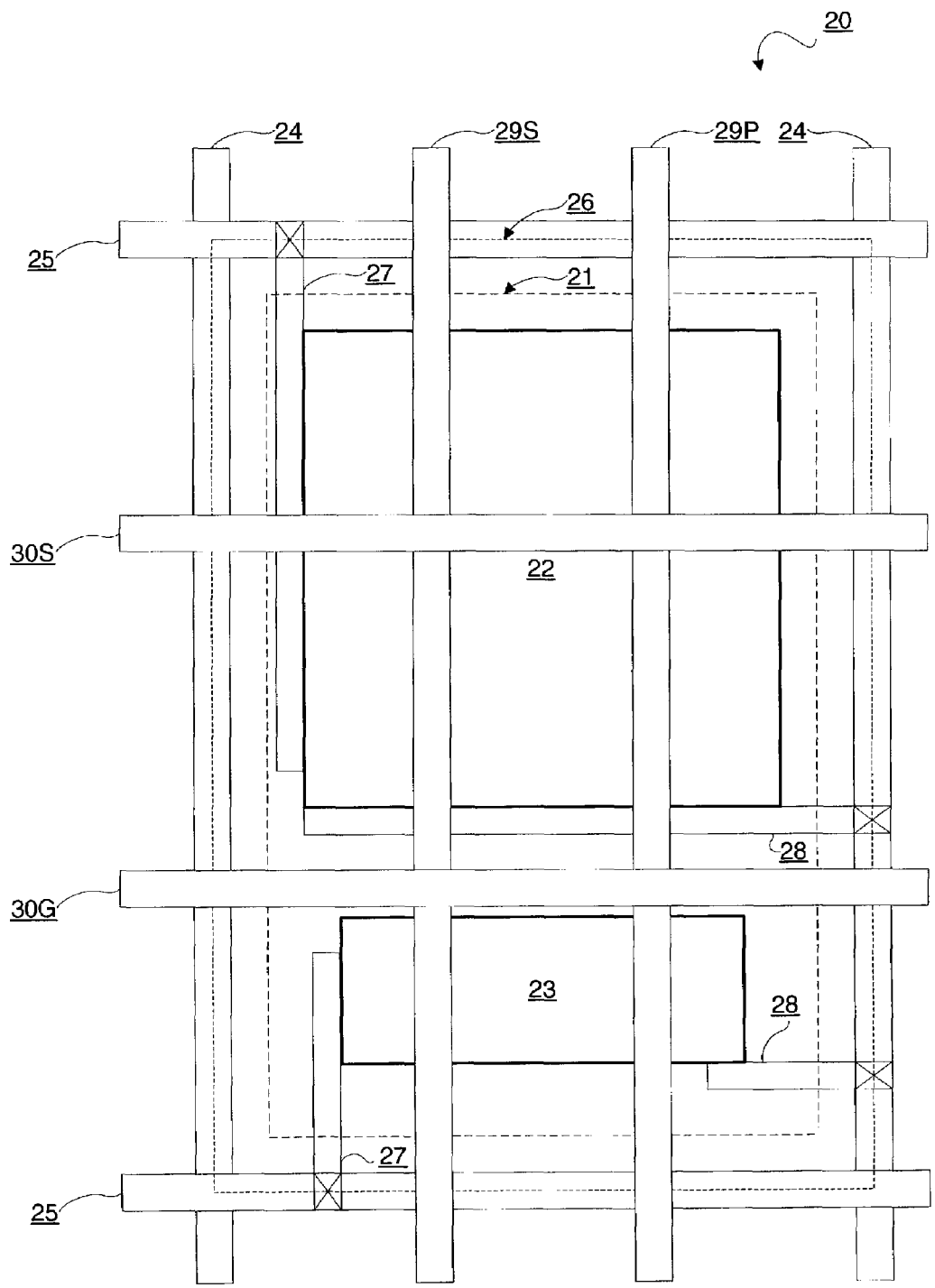
FIG. 3 is a top down view of a block diagram of a portion of an exemplary embodiment of an integrated circuit in accordance with one or more aspects of the present invention.

Referring to FIG. 3, there is shown a top down view of a block diagram of a portion of an exemplary embodiment of an integrated circuit 20 in accordance with one or more aspects of the present invention. Integrated circuit 20 comprises a reserved region 21, indicated by a dashed line, for embedding core 22 and glue logic 23. From M1 are conductive lines 24, and from M2 are conductive lines 25. For purposes of clarity, conductive lines 24 are source power, vdd, lines, and conductive lines 25 are source ground, Vss, lines. Collectively, lines 24 and 25 form a power/ground ring 26, as indicated by a dashed line, around a cross-sectional area of reserved region 21. Power interconnects 27 connect core 22 and glue logic 23 to conductive lines 24. Ground interconnects 28 connect core 22 and glue logic to conductive lines 25.

To distribute load more efficiently thereby reducing IR losses, vias are dropped between layers from conductive lines extending over region 21 to power and ground interconnects in region 21. However, not all lines extending over region 21 are power and ground. So, for example, if lines 29 and 30 extend over region 21, lines 29S and 30S may be signal lines and line 29P and 30G may be Vdd and Vss lines, respectively.

Figure 4:
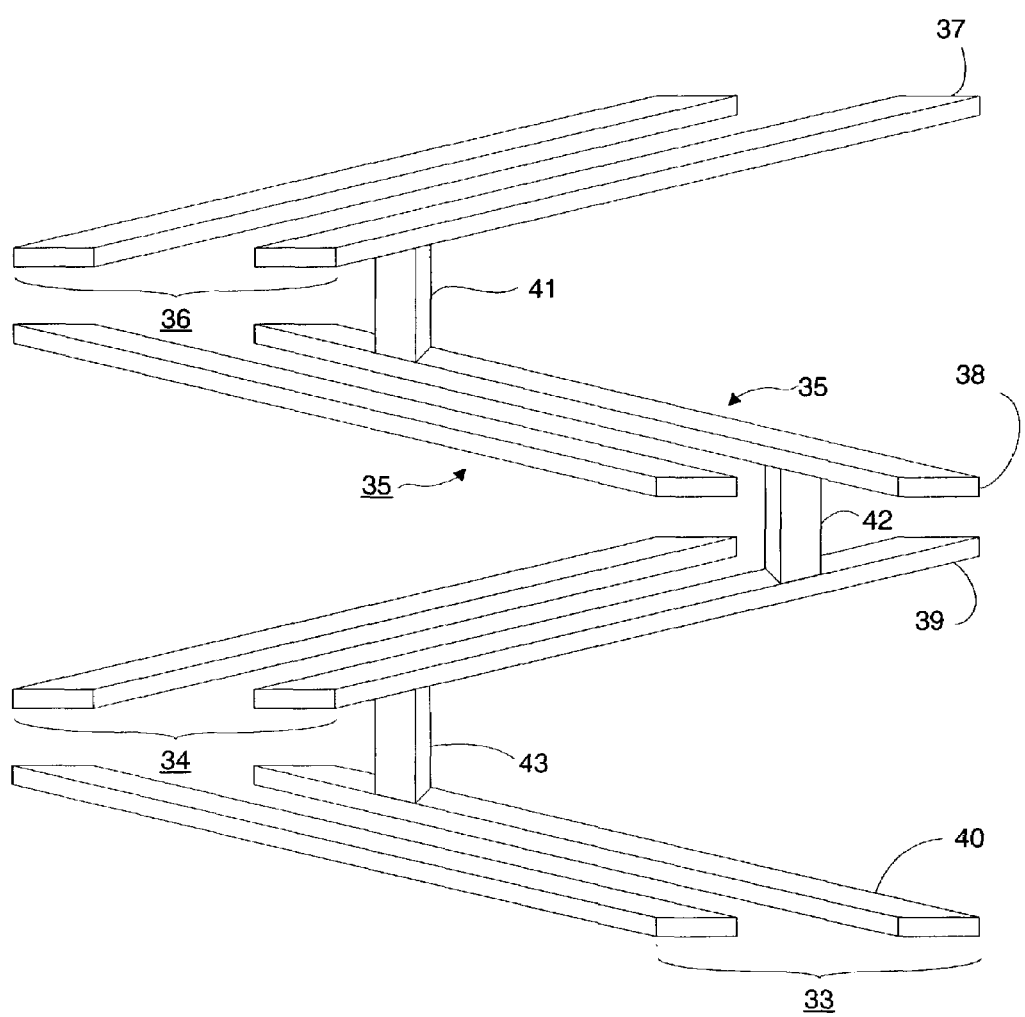
FIG. 4 is a perspective view of multiple levels of metal lines in accordance with one or more aspects of the present invention.

FIG. 4 is a perspective view of multiple levels of metal lines in accordance with one or more aspects of the present invention. Metal lines 33 and 34 at respective levels may be interconnect lines within reserved region 21 for an embedded device, and metal lines 35 and 36 may extend above reserved region 21. So, for example, suppose conductive lines 37 and 38 extend over an embedded region 21 and suppose conductive lines 39 and 40 are interconnect lines within such an embedded region 21, then if conductive lines 37 through 40 may be coupled, using vias 41, 42 and 43.

Figure 5:
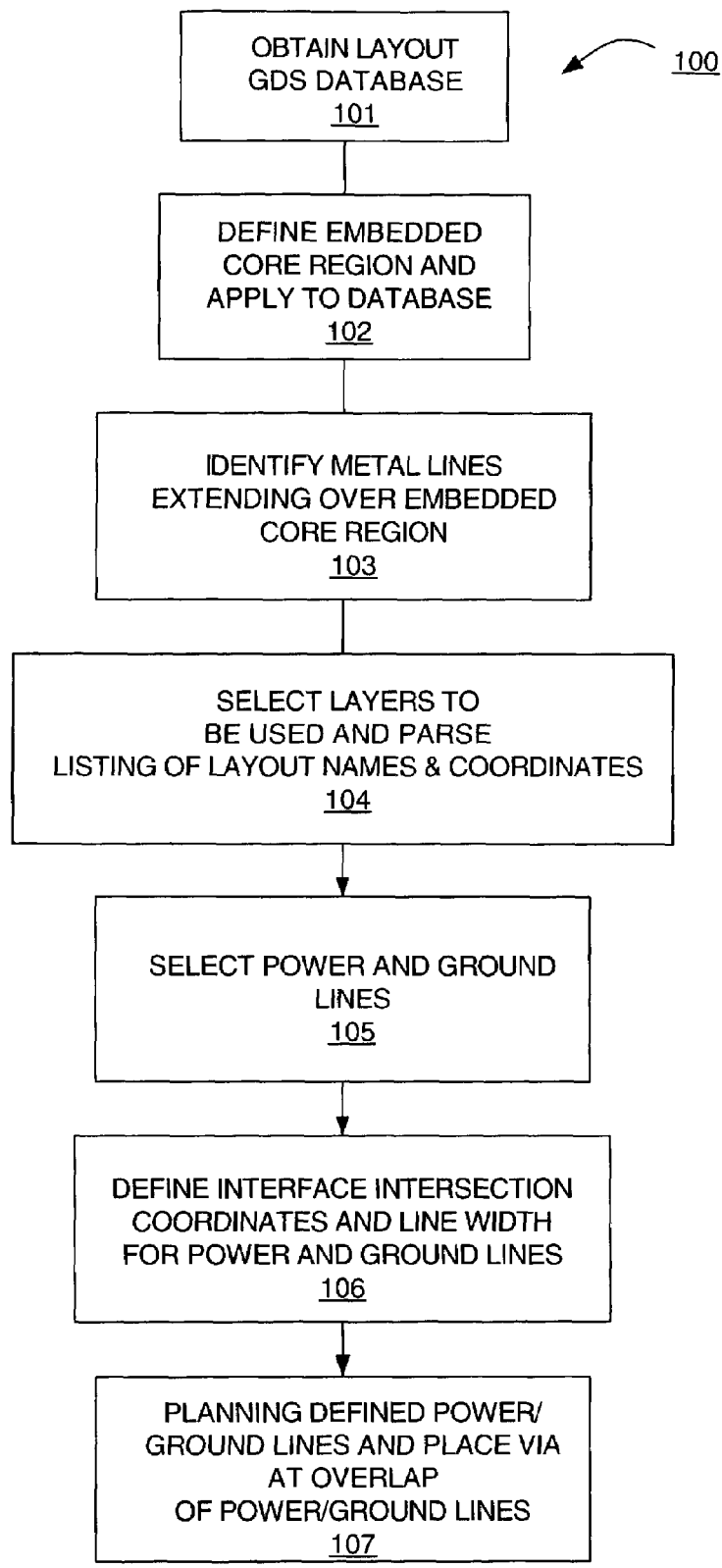
FIG. 5 is a process flow diagram of an embedded via drop process in accordance with one or more aspects of the present invention.

FIG. 5 is a process flow diagram of an embedded via drop process 100 in accordance with one or more aspects of the present invention. At step 101, a physical layout database for an integrated circuit 10 is obtained. Conventionally, a physical layout database is a binary file, sometimes referred to as a "GDS" file.

At step 102, a removal region, namely embedded core region 21, is defined. This includes an area as well as a height or highest metal layer, and thus metal interconnect layers may be identified by whether or not they extend over embedded core region 21 in response to applications to a database from step 101.

At step 103, metal lines are identified as extending over embedded core region 21. Information regarding these metal lines is extracted and converted from binary information to text information, such as from a GDS file to an ASCII text file. Thus, a textual list, including coordinate information, of conductive lines extending over embedded core region 21 is obtained. This textual list will include layout name and host domain coordinates. This information may be used as data for a place and route operation for embedded core region 21, and thus when layout databases of a host device and an embedded device, including a gasket module, are merged, as described below, coordinates will be in complete agreement. Thus, for example, information for metal lines of layers 35 and 36 extending over embedded core region 21 are extracted for placement data for a place and route tool in step 107, namely, for planning and placement for an embedded device and gasket module.

At step 104, information obtained at step 103 may be limited to selected layers. Because layer information is known, namely, height of conductive lines is known, location and width information for feed through needs to be determined for dropping vias. So, for purposes of clarity by example, it shall be assumed that metal layers 33 and 34 comprise power and ground interconnect lines within embedded region 12, and metal layers 35 and 36 comprise power and ground lines extending over embedded region 21. Accordingly, a text listing from step 103 may be limited to selected layers, and further may be parsed into respective layers. So for example, conductive lines may be parsed into conductive lines of layer 35 and conductive lines of layer 36.

Embedded circuitry, such as glue logic, which may comprise standard cells, and an embedded core, conventionally have a layout done in an embedded domain of coordinate information. Referring to FIG. 1, for example, a lower left corner 50 of host device 11 may have (0,0) x and y coordinates in a host domain for each respective identified layer, but a lower left corner 51 of embedded device 21 may have (0,0) coordinates in an embedded domain. Notably, it is possible to adjust coordinate system such that a host device and an embedded device are in a same domain, namely, the host domain; however, this significantly slows operation of a placement and route (P&R) tool. In other words, P&R tools conventionally operate faster on smaller areas.

At step 105, information obtained at step 104 is filtered by naming convention for power and ground. So, for example, power and ground lines may have a layout name such as Vdd and Vss, respectively. Thus, by keying on Vdd and Vss nomenclature, it is possible to obtain a textual listing of layout name and host domain coordinates for power and ground lines for selected layers extending over embedded core region 21.

At this point it should be appreciated that a list of layout name and host domain coordinates for conductive lines for Vdd and Vss extending above an embedded core region 21 is generated.

At step 106, coordinates are determined for identified lines from step 105. In particular, these coordinates may be converted to embedded domain coordinates. So, for example, suppose host domain coordinates (a,b) are (12000, 12600) corresponding to (0,0) in an embedded domain. A line extending over an embedded core region 12 and extending across an x-axis of such a region, would have y-coordinates of 0 in an embedded domain, which would be a y-coordinates of 12600 in the example for a host domain.

Referring again to FIG. 2, for a conductive line 14, location 54 is at (X1, Y1) and location 53 is at (X2, Y2). Continuing the above example, if location 54 is (12500, 12600), and if location 53 is (12800, 12600), then via data coordinates (X3, Y3) in an embedded domain are:

$$X3=((X1-a)+(X2-a))/2, \text{ and} \quad (1)$$

$$Y3=((Y1-b)+(Y2-b))/2. \quad (2)$$

For the example above, (X3,Y3) in an embedded domain are (650,0). These coordinates represent a center point 55 of conductive line 14. Width, W1, 56 of conductive line 14 is the absolute value of the quantity X1 minus X2. Suppose a conductive line was above and orthogonal to conductive line 14, the above coordinate conversion could be done to find a center point and a width of such a line. Suppose such a line had a center point at (X4,Y4). For example, suppose such a line was at (0,400) in embedded domain coordinates. Thus, such a line would cross a y-axis 57. Notably, coordinate axis intersection may be determined at either proximal, zero reference, or proximal axis boundaries of embedded region 21.

Axis or interface intersection coordinates for each Vdd and Vss conductive line above embedded region 21 for selected metal layers are determined, as well as corresponding line widths, at step 106.

Figure 5A:
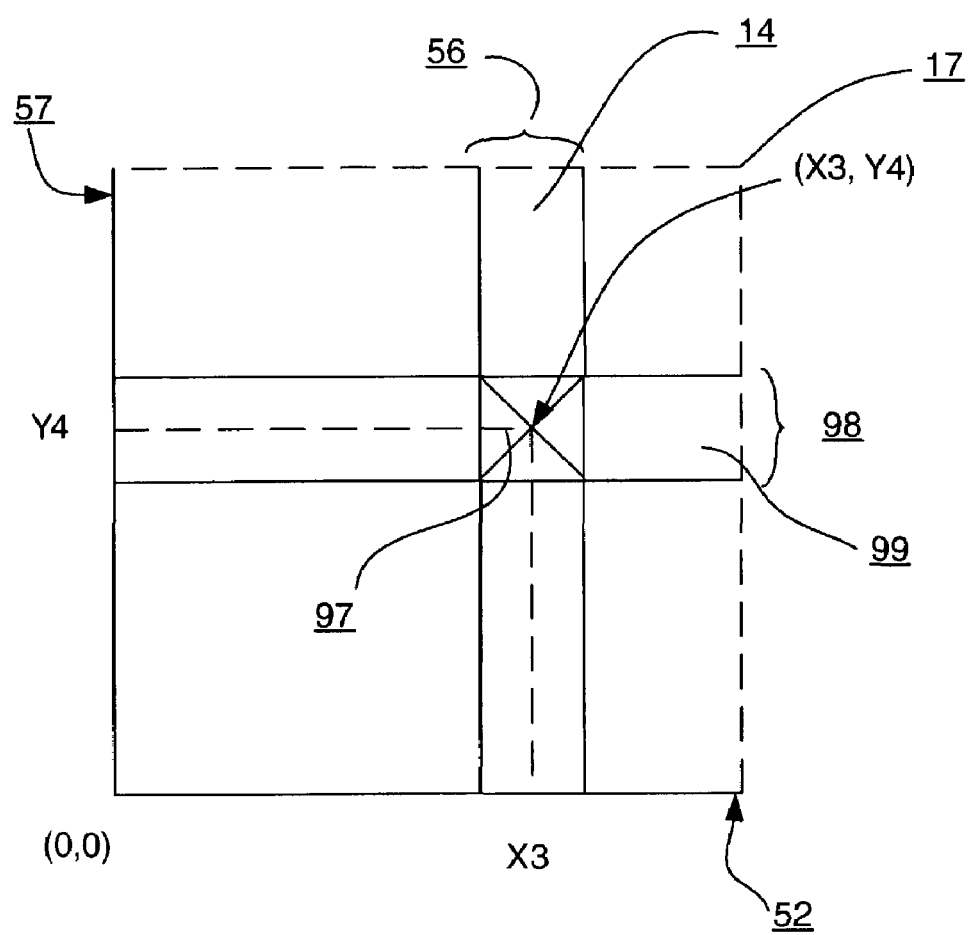
FIG. 5A is a graph of an exemplary interface in accordance with one or more aspects of the present invention.

At step 107 physical metal and via drop planning is done using such information. In other words, power and ground lines extending over an embedded core region are now coordinate converted and planned into such an embedded core region for subsequent P&R operations for such an embedded core region, described below in more detail. At step 107, with respect to via planning, each intersection of metal lines may be determined by cross referencing (X3,Y3) and (X4,Y4) coordinates. In other word, overlapping locations of two lines may be determined. Moreover, width of the overlap may be determined. Therefore, at each such intersection, unless a via already exists, a command to a P&R tool may be to place a via having a width, W, at a level. FIG. 5A is a graph of an exemplary interface 17 in accordance with one or more aspects of the present invention. Continuing the above example, intersection coordinates (X3,X4) indicate a center point for dropping a via, (650, 400) in an embedded domain in the above example. If a via is dropped from conductive line 99, width 98 is a prior known and width 56 is determined so via 97 cross-sectional area may be within or equal to widths 56 and 98.

While the above description has been limited to metal lines extending above embedded region 21, metal lines extending into embedded region 21 may be coupled by vias to conductive lines extending over embedded core region 21. Notably, power and ground connection information for layout of an embedded device is separate from layout information for a host device. However, as described above, axis intersection coordinates and line widths for lines extending above an embedded core region may be determined, and with this knowledge overlapping locations may be determined along with width of overlap. Moreover, by combining this information with layout information for power and ground for an embedded device, vias may be placed from lines extending above embedded core region 21 to power and ground lines within embedded core region 21.

Figure 6:
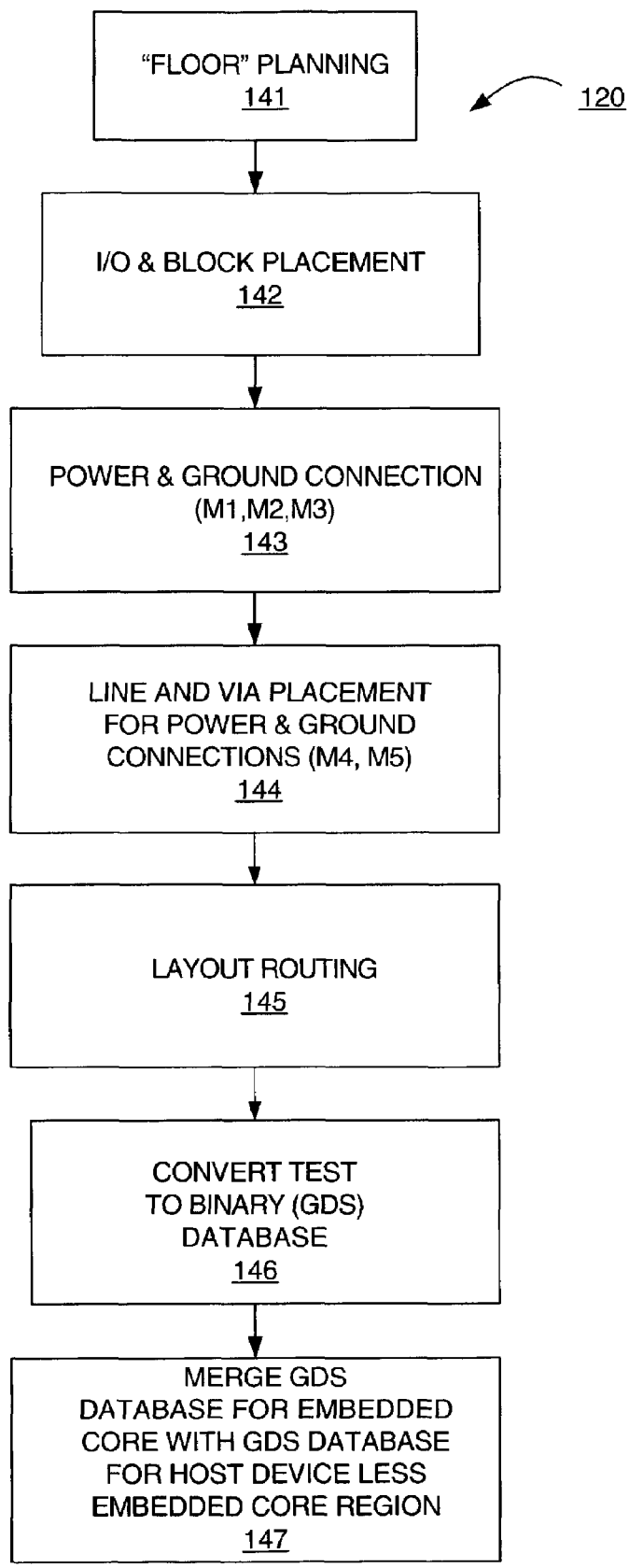
FIG. 6 is a process flow diagram of an exemplary embodiment of a place and route (P&R) process in accordance with one or more aspects of the present invention.

Referring to FIG. 6., there is shown a process flow diagram of an exemplary embodiment of a P&R process 140 in accordance with one or more aspects of the present invention. At step 141 architectural or "floor" planning for placement of circuitry blocks, such as a core, standard cells and discrete logic, among other elements, is done for an embedded core region 21. At step 142, I/O and block placement for such an embedded core region is done.

At step 143, connections for Vss and Vdd are laid out for inside an embedded core region. So, for example, assume power connection for Vss and Vdd for interconnects within embedded core region 21 are at metal levels M1, M2 and M3. Then at step 143 interconnects 27, 28 for an embedded device and glue logic would be made for levels M1, M2 and M3.

At step 144, placement of power and ground lines and vias is done, for example with a P&R tool. To improve power distribution, as well as to reduce risk of electromigration and causes of IR loss, vias to metal lines are made. At step 144, information from physical metal and via drop planning, describe above at step 107, is used to place power and ground lines and to generate via connections to lower level metal layers. Continuing the above example, vias may be placed between layers, namely any combination of connections from M4 and/or M5 to any combination of connections to M1, M2 and/or M3. So, for example, a via from M5 to M4 (M5->M4) may be created, as well as chain of vias. Notably, it may not be possible to have such a chain of vias be approximately vertically aligned with one another. However, a chain of vias may be vertically aligned, or may be a sequence of non-vertically aligned steps. Continuing the above example, examples of via chains include, but are not limited to, M5->M4 M4->M3 M3->M2 M2->M1 and M4->M3 M3->M2 M2->M1. Moreover, a layer may be skipped or omitted, so for example other via chains include, but are not limited to, M5->M3 M3->M2 M2->M1, M5->M3 M3->M2, M4->M2 M2->M1, M4->M3 M3->M2. Thus, by having vias dropped to a lower level, for example wherever overlapping Vdd or Vss lines are found, and no via currently exists, facilitates power and ground distribution.

At step 145, layout routing is done, for example with a P&R tool. This routing includes conductive lines and vias placed at step 144. Notably, because lines extending across and over an embedded core region 21 may be located by metal line intersecting points along a cross-sectional area interface 17 of embedded core region 21 and host device 11, areas of overlapping lines, both those conductive lines overlapping above embedded core region 21 and those conductive lines above embedded core region 21 and overlapping with a line in embedded core region 21 may be located for routing without manual intervention.

At step 146 layout routing done at step 145 is converted from text version to a binary version, namely, a binary database or tapeout database. At step 147, the database obtained at step 101, less a removed portion in response to step 102, is merged with GDS out database file from step 146. Such a merger may include transformation of coordinates from an embedded core domain to a domain for integrated circuit 10. Moreover, a portion of a host GDS database may have layout data removed for an embedded core region or be over written, i.e., no removal, by embedded core layout data.

Figure 7:
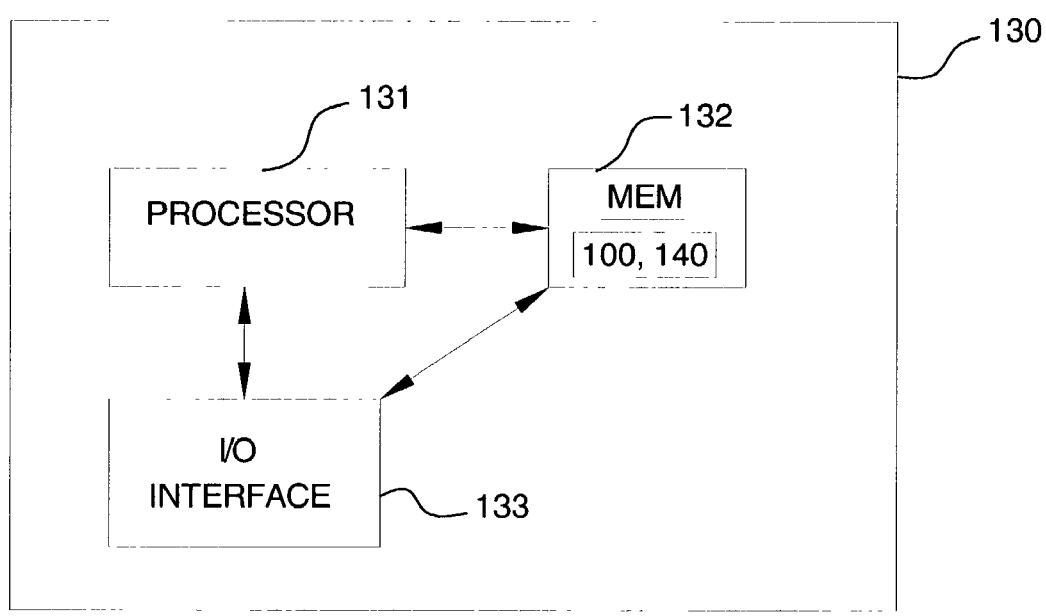
FIG. 7 is a block diagram of a computer system in accordance with one or more aspects of the present invention.

Referring to FIG. 7, there is shown a block diagram of a computer system 130 in accordance with one or more aspects of the present invention. Processor 131 is coupled to memory 132, and I/O interface 133. I/O interface 133 may be coupled to memory 132 as is known for direct memory addressing. Memory 132 may comprise all or a portion of processes 100 and/or 120 from time to time. Computer system 130 may be programmed with a P&R tool.

Embodiments of the present invention may be implemented as program products for use with a computer system 130. The program(s) of the program product defines functions of the embodiments and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

Although various embodiments which incorporate the teachings of the present invention have been shown and described in detail herein, those skilled in the art can readily devise many other varied embodiments that still incorporate these teachings. Claims listing steps do not imply any order of the steps unless such order is expressly indicated. All trademarks are the property of their respective owners.

What is claimed is:

1. A process for forming vias between conductive lines at different layer levels, comprising:

obtaining a host integrated circuit layout database;
   defining an embedded core region within the host integrated circuit layout database;
   determining at least one of a source power line and a ground line extending over the embedded core region from the host integrated circuit layout database for a layer level;
   determining locations where the at least one of the source power line and the ground line overlap a perimeter of the embedded core region;
   planning the at least one of the source power line and the ground line placement; and
   planning via placement from the at least one of the source power line and the ground line in partial response to the locations determined.

2. The process of claim 1 further comprising:

obtaining an embedded integrated circuit layout database; and
   obtaining interconnect placement information for at least one of source power interconnect and ground interconnect from the embedded integrated circuit layout database;
   wherein the via placement is planned for connecting the at least one of the source power line and the ground line to the at least one of the source power interconnect and the ground interconnect, respectively.

3. The process of claim 2 further comprising:

routing vias from the at least one of the source power line and the ground line to the at least one of the source power interconnect and the ground interconnect, respectively; and
   merging the embedded integrated circuit layout database with the host integrated circuit layout database.

4. The process of claim 3 wherein the step of determining the at least one of the source power line and the ground line extending over the embedded core region from the host integrated circuit layout database for the layer level comprises converting layout information in binary form to layout information in textual form.

5. The process of claim 4 wherein the step of determining the at least one of the source power line and the ground line extending over the embedded core region from the host integrated circuit layout database for the layer level comprises selecting the layer level to be elevated above the embedded core region.

6. A process for laying out vertical interconnects between conductive lines at different layer levels, comprising:

obtaining a host integrated circuit layout database;
   defining an embedded core region within the host integrated circuit layout database;
   selecting at least one metal layer extending above the embedded core region;

determining source power and ground line information for the at least one metal layer responsive to the embedded core region and the at least one metal layer from the host integrated circuit layout database;

determining axis intersection coordinates from the source power and ground line information and the embedded core region; and planning placement of the vertical interconnects in partial response to the axis intersection coordinates; and placing vias in response to the calculating overlaps.

7. The process of claim 6 further comprising:

obtaining an embedded integrated circuit layout database;

obtaining source power and ground horizontal interconnect placement information from the embedded integrated circuit layout database;

routing the vertical interconnects from the at least one metal layer to horizontal source power and ground horizontal interconnects; and merging the embedded integrated circuit layout database with the host integrated circuit layout database.

8. The process of claim 7 wherein the host integrated circuit layout database is in a binary format, and wherein the source power and ground line information for the at least one metal layer is determined after, converting at least a portion of the host integrated circuit layout database responsive to the at least one metal layer extending above the embedded core region from the binary format to a textual format; and applying a signal naming convention to at least the portion converted to the textual format to identify the source power and ground line information from signal information.

9. A process for automating via placement and routing, comprising:

obtaining a first layout database, the first layout database for a host integrated circuit device, the first layout database in a binary format;

reserving a reserved area in the first layout database, the reserved area for placement of a core integrated circuit device and interconnect logic at least in part for coupling the core integrated circuit device to the host integrated circuit device, the reserved area limited in part to a first group of selected metal layers;

accessing from the first layout database layout names and coordinates for conductive lines extending over the reserved area and not part of the first group of selected metal layers, wherein the conductive lines are part of a second group of selected metal layers;

determining axis intersection coordinates for the conductive lines, the axis intersection coordinates for an x-axis and a y-axis corresponding to the reserved area;

calculating overlaps for the conductive lines for the second group of selected metal layers;

placing the conductive lines; and placing vias in response to the overlaps calculated.

10. The process of claim 9 wherein the step of calculating overlaps comprises using the axis intersection coordinates to determine line widths and center coordinates.

11. The process of claim 10 wherein the step of calculating overlaps comprises determining center coordinates of the conductive lines, wherein some of the conductive lines are at least approximately perpendicular to one another and are at different metal layers in the second group of selected metal layers.

12. The process of claim 11 wherein the step of calculating overlaps comprises finding points of intersection from the center coordinates.

13. The process of claim 12 wherein the step of calculating overlaps comprises taking a difference between two axis intersection coordinates for each of the conductive lines to determine a width for each thereof.

14. The process of claim 9 further comprising:

obtaining an embedded integrated circuit layout database;

obtaining source power and ground interconnect information from the embedded integrated circuit layout database;

routing the vias from the second group of metal layers selected to the first group of metal layers selected in response to the vias placed; and merging the embedded integrated circuit layout database with the host integrated circuit layout database.

15. The process of claim 14 further comprising routing vias between metal layers from the second group of metal layers selected in response to the via placement planned.

16. The process of claim 9 wherein the step of accessing comprises converting at least a portion of the first layout database associated with the second group of selected metal layers from the binary format to a textual format.

17. The process of claim 16 wherein the step of accessing comprises applying power source nomenclature to the portion of the first layout database converted to the textual format to identify power source lines in the conductive lines.

18. The process of claim 16 wherein the step of accessing comprises applying ground source nomenclature to the portion of the first layout database converted to the textual format to identify ground source lines in the conductive lines.

19. A signal-bearing medium containing a place and route program which, when executed by a processor in response to a reserved area for a first layout database provided for a host integrated circuit device, causes execution of a method comprising:

applying the reserved area to the first layout database, the reserved area for placement of a core integrated circuit device and interconnect logic at least in part for coupling the core integrated circuit device to the host integrated circuit device, the reserved area limited in part to a first group of selected metal layers;

accessing from the first layout database layout names and coordinates for conductive lines extending over the reserved area and not part of the first group of selected metal layers, wherein the conductive lines are part of a second group of selected metal layers;

determining axis intersection coordinates for the conductive lines, the axis intersection coordinates for an x-axis and a y-axis corresponding to the reserved area;

calculating overlaps for the conductive lines for the second group of selected metal layers;

placing the conductive lines; and locating via placement in response to the overlaps calculated.

20. A signal-bearing medium containing a place and route program which, when executed by a processor in response to a reserved area for a first layout database provided for a host integrated circuit and availability of a second layout database for an embedded integrated circuit, causes execution of a method comprising:

applying the reserved area to the first layout database, the reserved area for placement of a core integrated circuit at least into the host integrated circuit, the reserved area limited in part to a first group of selected metal layers;

accessing from the first layout database layout names and coordinates for conductive lines extending over the reserved area and not part of the first group of selected metal layers, wherein the conductive lines are part of a second group of selected metal layers;

determining axis intersection coordinates for the conductive lines, the axis intersection coordinates for an x-axis and a y-axis corresponding to the reserved area;

calculating overlaps for the conductive lines for the second group of selected metal layers; and placing the conductive lines;

placing vias in response to the overlaps calculated;

placing source power and ground interconnect information from the embedded integrated circuit layout database;

routing vias from the second group of metal layers selected to the first group of metal layers selected in response to the vias placed; and merging the embedded integrated circuit layout database with the host integrated circuit layout database.

21. The method of the signal-bearing medium of claim 20 wherein the step of calculating overlaps comprises:

determining points of intersection; and overlapping width for the points of intersection.

* * * * *